United States Patent [19]

Tanaka

[11] 4,138,613

[45] Feb. 6, 1979

[54] SWITCHING CIRCUIT

[75] Inventor: Kojiro Tanaka, Yachiyo, Japan

[73] Assignee: Kabushiki Kaisha Daini Seikosha, Japan

[21] Appl. No.: 823,163

[22] Filed: Aug. 9, 1977

Related U.S. Application Data

[63] Continuation of Ser. No. 603,119, Aug. 8, 1975, abandoned.

[30] Foreign Application Priority Data

| Aug. 14, 1974 | [JP] | Japan | 49-93066 |
| Aug. 14, 1974 | [JP] | Japan | 49-93067 |
| Aug. 23, 1974 | [JP] | Japan | 49-96850 |
| Aug. 29, 1974 | [JP] | Japan | 49-99225 |
| Sep. 2, 1974 | [JP] | Japan | 49-100663 |
| Sep. 2, 1974 | [JP] | Japan | 49-100664 |

[51] Int. Cl.² .................. H03K 5/01; H03K 3/286
[52] U.S. Cl. .................. 307/247 A; 307/238; 340/365 E
[58] Field of Search ............. 307/247 A, 247 R, 238, 307/291; 328/196, 206, 165; 340/365 E

[56] References Cited

U.S. PATENT DOCUMENTS

| 3,593,036 | 7/1971 | Ma et al. | 307/247 A |
| 3,624,518 | 11/1971 | Dildy, Jr. | 307/247 A |
| 3,795,823 | 3/1974 | Morgan et al. | 307/247 A |

Primary Examiner—John Zazworsky
Attorney, Agent, or Firm—Robert E. Burns; Emmanuel J. Lobato; Bruce L. Adams

[57] ABSTRACT

A switching circuit including a flip-flop which receives a switching signal that sets the flip-flop and which receives a reset signal which resets the flip-flop. A latching circuit, responsive to a clock signal, is connected to receive an output signal of the flip-flop for developing a latching circuit output signal corresponding to the output signal of the flip-flop at a time the clock signal is applied thereto. A reset signal and a clock signal developed repetitively and out of phase are respectively applied to the flip-flop and the latching circuit so that the latching circuit output signal can change only after the flip-flop has been reset.

7 Claims, 9 Drawing Figures

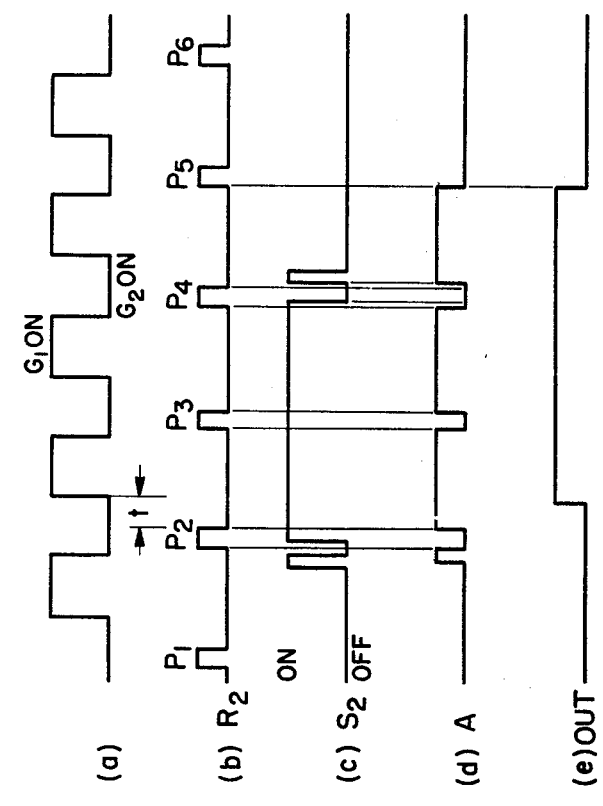
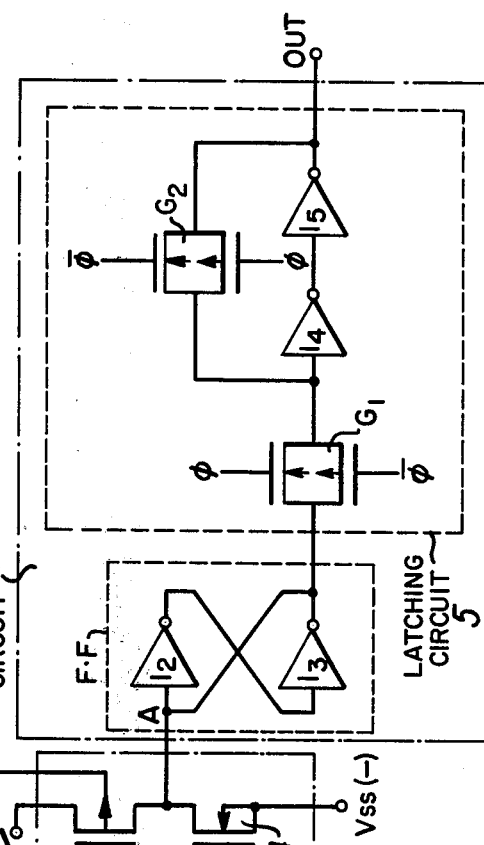
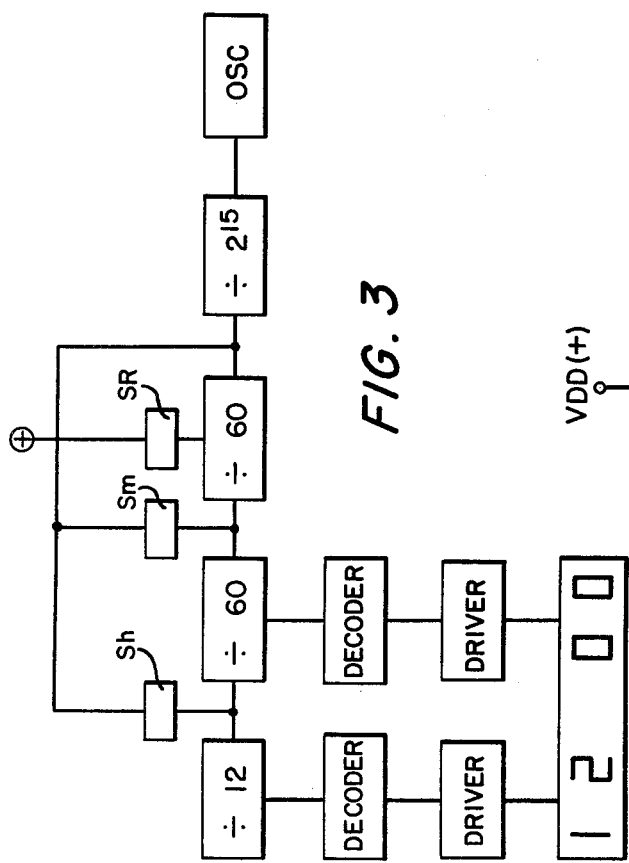
FIG. 1
FIG. 2
FIG. 3

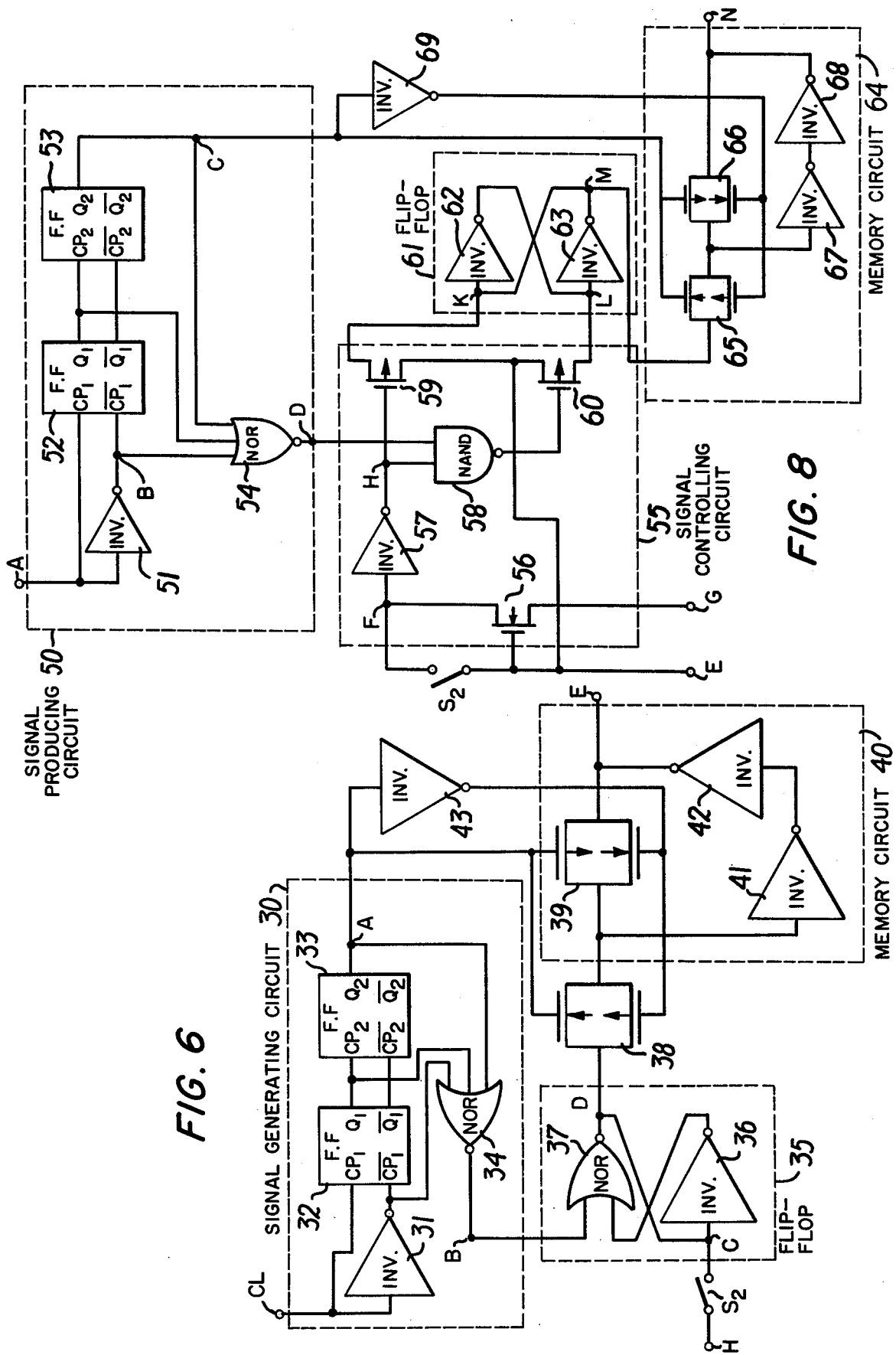

SWITCHING CIRCUIT

This is a continuation, of application Ser. No. 603,119, filed Aug. 8, 1975, and now abandoned.

BACKGROUND OF THE INVENTION

This invention relates to a switching circuit for generating the output signal having no chattering.

In the conventional type, as switching circuit for preventing the chattering, it was composed of the switch of a pushed closing type, resistor, condensor and multi-vibrator. On the other hand, it was composed of the transfer switch having two contacts which are respectively operated from ON to OFF or vice versa by the pushing operation and the set reset flip-flop. However, the switching circuit having the resistor and condensor etc can not eliminate the chattering which is larger than the constant of said condensor and resistor and is generated by said ON-OFF switch. The reliability of said switching circuit is not preferable, further since said transfer switch becomes larger type in relating to the switching circuit having said transfer switch, said switching circuit becomes larger size. Furthermore, lead switch is applied for preventing the chattering, but it has the insufficiency of the reliability.

OBJECT OF THE INVENTION

The present invention aims to eliminate the above noted difficulty and insufficiency, and therefore it is the primary object of the present invention to provide a signal output having no chattering in the switching circuit.

Further object of the present invention is to provide a high reliability of the switching circuit.

SUMMARY OF THE INVENTION

In a switching circuit, said circuit generates the control signal as the first signal and the resetting pulse as the second signal, and controls the switching signal by said switching signal control circuit, and obtains the switching output having no chattering via flip-flop circuit which synchronizes to said control signal.

BRIEF DESCRIPTION OF THE DRAWINGS

The above mentioned and further objects, features and advantages of the present invention will become more obvious from the following description when taken in connection with the accompanying drawings, which show the preferred embodiments and wherein:

FIG. 1 shows the first embodiment of the switching circuit of the present invention, FIG. 2 shows the wave shapes of the switching circuit in FIG.1, FIG. 3 shows the one embodiment of the electronic timepiece in which said switching circuit in FIG. 1 is applied, FIG. 6 shows the third embodiment of the switching circuit of the present invention, FIG. 8 shows the fourth embodiment of the switching circuit of the present invention.

DETAILED DESCRIPTION OF THE INVENTION

Figure 4:
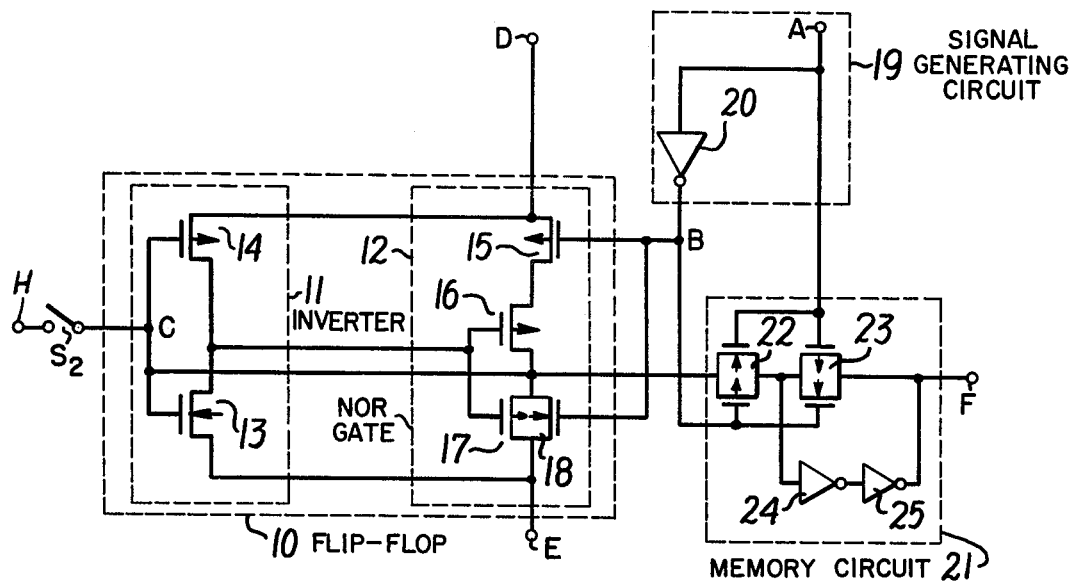
FIG. 4 shows the second embodiment of the switching circuit of the present invention.

This invention relates to the improvement of a switching circuit for obtaining a switching mode having no chattering.

Referring now to the first embodiment of the present invention illustrated in the accompanying drawings: in FIGS. 1 and 2, the switching circuit is composed of the switch $S_2$, the C-MOS inverter 1 which receives power from said switch $S_2$, and the memory circuit 2 which memorizes the output signal of said inverter 1. Furthermore, said switch $S_2$ is connected between the source terminal of the P-channel MOS transistor 3 of the C-MOS inverter and the power supplying terminal $V_{DD}(+)$. The output terminal of said C-MOS inverter 1 is connected to the memory circuit 2 and is connected to the input terminal of the flip-flop circuit F.F which is of the preferential resetting. The output terminal of said flip-flop F.F is connected to the input terminal of the latching circuit 5. Said flip-flop F.F is composed of the inverters $I_2$ and $I_3$, said latching circuit 5 is composed of the transmission gate $G_1$ which is composed of a C-MOS transistor pair, the inverter $I_4$ and $I_5$ and the transmission gate $G_2$. The output terminal of said switching circuit is the output terminal OUT of said latching circuit 5.

Further, referring to the operation of said switching circuit illustrated by the waveforms in accompanying FIG. 2, the clock pulse signal $\phi$ in FIG. 2(a) is employed for controlling said transmission gates $G_1$ and $G_2$ which are composed of the C-MOS transistor pairs which comprise said latching circuit 5. The resetting pulse signal $R_2$ which is applied to the input gate terminal of said C-MOS inverter 1 is synchronized to the clock pulse signal $\phi$ and is generated during the interval when said clock pulse signal $\phi$ is lower level. This operation is indicated in FIG. 2(b), when said switch $S_2$ is operated as indicated in FIG. 2(c), which illustrates the chattering signals including ON and OFF positions generated at the closing operation and the opening operation of said switch $S_2$. Therefore, considering the state of the output terminal OUT of said latching circuit 5 in the closing operation of said switch $S_2$, when said switch $S_2$ is operated to ON-position in the case in which said resetting pulse signal $R_2$ is not present and in which said clock pulse signal $\phi$ is at the lower level, the output state of said output terminal A of said C-MOS inverter 1 is not able to attain transfer of the information to said latching circuit 5 through said transmission gate $G_1$ of said latching circuit 5. In this situation, when switch $S_2$ is changed to OFF-position, the states of said output terminal A of said inverter and said output terminal OUT of said latching circuit are not changed.

However, the states of said input and output terminals of said flip-flop F.F are changed to the lower level by the resetting pulse signal $P_2$ which is applied to the input terminal of said inverter 1. Afterwards, said lower level of said terminals are continued without regard to the setting of said switch $S_2$. When said resetting pulse signal $P_2$ terminates ceased and said switch $S_2$ continues in the ON-position, the input terminal A of said flip-flop circuit F.F is changed to the higher level. After an interval t, the clock pulse signal $\phi$ is changed to the higher level, the transmission gate $G_1$ is opened, and said latching circuit 5 is able to write the information comprised of the higher level of the output state in said flip-flop F.F, whereby the state of the output terminal OUT in said latching circuit changes to the higher level. When said resetting pulse signal $P_3$ is applied, the output signal of said flip-flop F.F is changed to the lower level without regard to the setting of said switch $S_2$. After the resetting pulse signal $P_3$ terminates, said flip-flop F.F output changes to the higher level in the case when said switch $S_2$ is in the to ON-position. However though said transmission gate $G_1$ is closed, the output terminal OUT of said latching circuit is continually at the higher level.

When said resetting pulse $P_4$ is applied, the output state of said flip-flop F.F is changed to the lower level. After some chattering of a small level, said switch $S_2$ changes to OFF-position whereby said flip-flop F.F changes to the higher level again, and the output terminal OUT of said latching circuit 5 is continually at the higher level.

Therefore, when said switch $S_2$ completely changes to the OFF-position, said resetting pulse signal $P_5$ is applied, and the output of said latching circuit 5 is changed to the lower level as it was at the beginning.

As said above noted description, in the construction of the switching circuit as indicated in FIG. 1, the output terminal OUT of said switching circuit changes to the higher level at the starting point of the clock pulse $\phi$ which follows said resetting pulse $P_2$, the output terminal OUT of said switching circuit is changed to the lower level at the starting point of the resetting pulse signal $P_5$.

FIG. 3 shows the block circuit of the electronic timepiece which is provided with the second resetting switch SR, the minute fast forwarding switch Sm and the time fast forwarding switch Sh. Therefore, it is able to prevent chattering by applying the switching circuit in FIG. 1 to said switches SR, Sm and Sh whereby it is possible to attain the accurate electronic timepiece.

Furthermore, the time t as indicated in FIG. 2(a) has to be kept in larger than the chattering generating time of said switch $S_2$. Generally the chattering generating time of said switch $S_2$ is about ten milliseconds, for example if the pulse width of said resetting pulse $R_2$ is set to a half of the pulse width of said clock pulse $\phi$, the sequential period of said clock pulse is preferably in 16HZ therefore the chattering generating time is 22m second.

In the above noted description, according to the present invention, when the resetting pulse R was generated and the time t had elapsed wherein said time t is larger than the time of termination of the chattering, the output signal of flip-flop F.F is read by the latching circuit 5. When the resetting pulse $R_2$ is generated and said flip-flop is reset, namely when said clock pulse $\phi$ is at the lower level, said transmission gate $G_1$ is closed and said transmission gate $G_2$ is opened. Since said latching circuit 5 memorizes the past information, the error operation by the chattering does not appear at the output terminal OUT of said latching circuit.

Therefore, since the circuit construction is very small, it is preferable to apply this switching circuit to a small sized electronic watch or to a device which has the problem of high current consumption. Since it is attained by the simple mechanichal switch Sz and integrated circuits, it is inexpensive.

Figure 5:
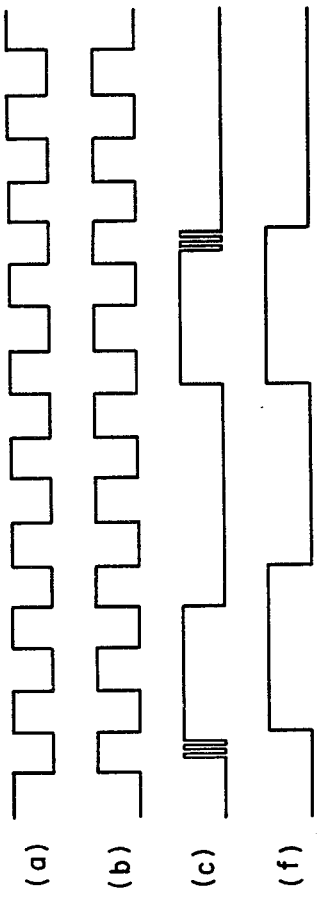
FIG. 5 shows the wave shapes of the switching circuit in FIG. 4.

Referring now to the second embodiment of the switching circuit of the present invention in FIGS. 4 and 5, numeral $S_2$ is the ON-OFF switch and is a mechanical switch. The one terminal of said switch $S_2$ is connected to the input terminal "H" to which the higher voltage is usually applied, the other terminal of said switch is connected to the setting terminal of the flip-flop circuit 10 of the preferential setting type via the connecting point "C". Said flip-flop circuit 10 includes the inverter 11 which is connected to the one terminal of said mechanical switch $S_2$ and the NOR-gate 12 which is connected to said inverter 11. Said inverter 11 is composed of the MOS-transistor 14 of the P-channel type and the MOS-transistor 13 of N-channel, the gate and drain terminals of said MOS-transistors 13 and 14 are mutually connected. Said NOR-gate 12 is composed of the MOS-transistors 15,16 and 17 of the P-channel type and the MOS-transistor 18 of N-channel type, the gate-terminals of said MOS-transistors 15 and 18 and the gate-terminals of said MOS-transistors 16 and 17 are respectively connected, and said MOS transistors 15,16,17 and 18 are mutually connected as indicated in FIG. 4. The input terminal "D" in which the higher voltage is applied is connected to the source terminal of said MOS-transistor 15 and is connected to the source terminal of said MOS-transistor 14 in said inverter 11. The gate terminals of said MOS-transistors 16 and 17 are connected to the drain terminals of said MOS-transistors 14 and 13 which constitute said inverter 11. The gate terminals of said MOS-transistors 13 and 14 which constitute said inverter 11 are connected to the connecting point of said MOS-transistors 16, 17 and 18. The source of said MOS-transistor 13 is connected to the other connecting point of said MOS-transistors 17 and 18.

The signal generating circuit 19 includes the input terminal A for receiving a clock pulse train composed of predetermined two voltage levels in sequential form, and the inverter 20 which is connected to said input terminal A. The clock pulse which is directly taken out from said input terminal A and an inverted clock pulse train is taken out via said inverter 20. Said inverter 20 is connected to the gate-terminal of said MOS-transistors 15 and 18 at node B which constitutes the resetting terminal of said flip-flop circuit 10 having the preferential setting. Furthermore, said flip-flop circuit 10 is able to operate as a flip-flop circuit having preferential setting by setting the resistance to a preliminary value for enlarging the ON-resistance of said mechanical switch $S_2$ and decreasing the switching resistance of said mechanical switch $S_2$.

Numeral 21 is the memory circuit which is composed of the transmission gates 22 and 23 and the inverters 24 and 25 which are connected in series with each other. The control terminals of said transmission gates 22 and 23 are connected each other, one of said control terminals is connected to the input terminal A of said signal generating circuit 19, the other one of said control terminals is connected to said inverter 20 via the connecting point "B". The input terminal of the transmission gate 22 is connected to the connecting points of said MOS-transistors 16, 17 and 18 which are part of said NOR-gate 12, the output terminal of the transmission gate 22 is connected to the input terminal of said transmission gate 23. The output terminal of said transmission gate 23 is connected to the output terminal F of said memory circuit 19. Further said inverters 24 and 25 are connected in parallel with said transmission gate 23.

Referring now to the operation of the switching circuit with reference to the wave shapes as indicated in FIG. 5, when the clock pulse "a" in FIG. 5 is applied to the input terminal A of said signal generating circuit 19, the pulse signal "b" which is synchronized with said clock pulse "a" appears at said connecting point "B".

When said mechanical switch $S_2$ is set to OFF-position, the output of said flip-flop circuit 10 is kept to the lower level. At this time, when said pulse signal "b" is at the higher level, the switching signal "c" of higher level having the chattering as indicated by wave shape "c" in FIG. 5 is applied to the input connecting point of said flip-flop circuit 10 by operating said mechanical switch $S_2$ to the ON-position. Therefore the MOS-transistor 14 of said inverter 11 becomes non-conductive or OFF, the MOS-transistor 13 becomes conductive or ON, the MOS-transistor 16 of said NOR-gate 12 becomes conductive or ON. At this time, the voltage level of the output terminal of said flip-flop circuit 10 which is connected to said connecting point "c" changes to a higher level because of the on-resistance of the MOS-transistor 18 which is larger than the switching resistance of said mechanical switch $S_2$. However, the lower level output being memorized by said memory circuit 21 appears at the output terminal "F" because the transmission gate 22 of said memory circuit 21 changes to OFF-position. After a while, when said pulse signal "b" changes to the lower level, MOS-transistor 15 becomes ON, MOS-transistor 18 becomes to OFF, said flip-flop circuit 10 completely changes to the higher level. The output of the higher level of said flip-flop circuit 10 is applied to the output terminal F via said inverters 24 and 25 because the ON and OFF states of said transmission gates 22 and 23 in said memory circuit 21 become reversal. Consequently the switching output "f" at the higher level and having no chattering appears at said output terminal "F".

Further, referring now to the OFF-operation of said mechanical switch $S_2$, when pulse signal "b" changes to the lower level MOS-transistors 14 and 15 of said flip-flop circuit 10 become conductive MOS-transistors 13, 16, 17 and 18 become non-conductive. However the output of said flip-flop circuit 10 is kept at the higher level of said mechanical switch $S_2$ and MOS-transistor 16 becomes conductive. Afterwards, when pulse signal "b" changes to the higher level, MOS-transistor 18 becomes conductive, whereby the output of said flip-flop circuit 10 changes to the lower level. However, said memory circuit 21 memorizes higher level and keeps the switching output at the higher level by the transmission gate 23 of said memory circuit 21 which becomes conductive. Afterwards, when said pulse signal "b" became lower level again, said transmission gate 22 becomes conductive, and the lower level output of said flip-flop circuit 10 is applied to the output terminal "F" via said memory circuit 21. Therefore a lower level output having no chattering during switching appears at said output terminal "F".

Further, when the pulse signal "b" is at the lower level, said mechanical switch $S_2$ is operated to the ON-position, and when the pulse signal "b" is at the higher level, said mechanical switch $S_2$ is operated to at the OFF-position whereby the switching output signal having no chattering is obtained as indicated in FIG. 5 (f).

According to the second embodiment, the set reset flip-flop circuit having preferential setting is connected to the switching circuit, and the switching signal determined by the ON and OFF setting of said mechanical switch is applied to the connecting point C of the setting side in said flip-flop circuit. Further, the pulse signal which is synchronized to the clock pulse is applied to the connecting point of the resetting side, and the output of said flip-flop circuit is transferred as the switching output via the memory circuit which memorizes in synchronism with said clock pulse. Therefore, it is possible to develop the switching output having no chattering without regard to the amount of the chatteries in said mechanical switch and to obtain an increase in reliability. It is possible to miniaturize the construction of said mechanical switch and to construct a simple ON-OFF switch.

Figure 7:
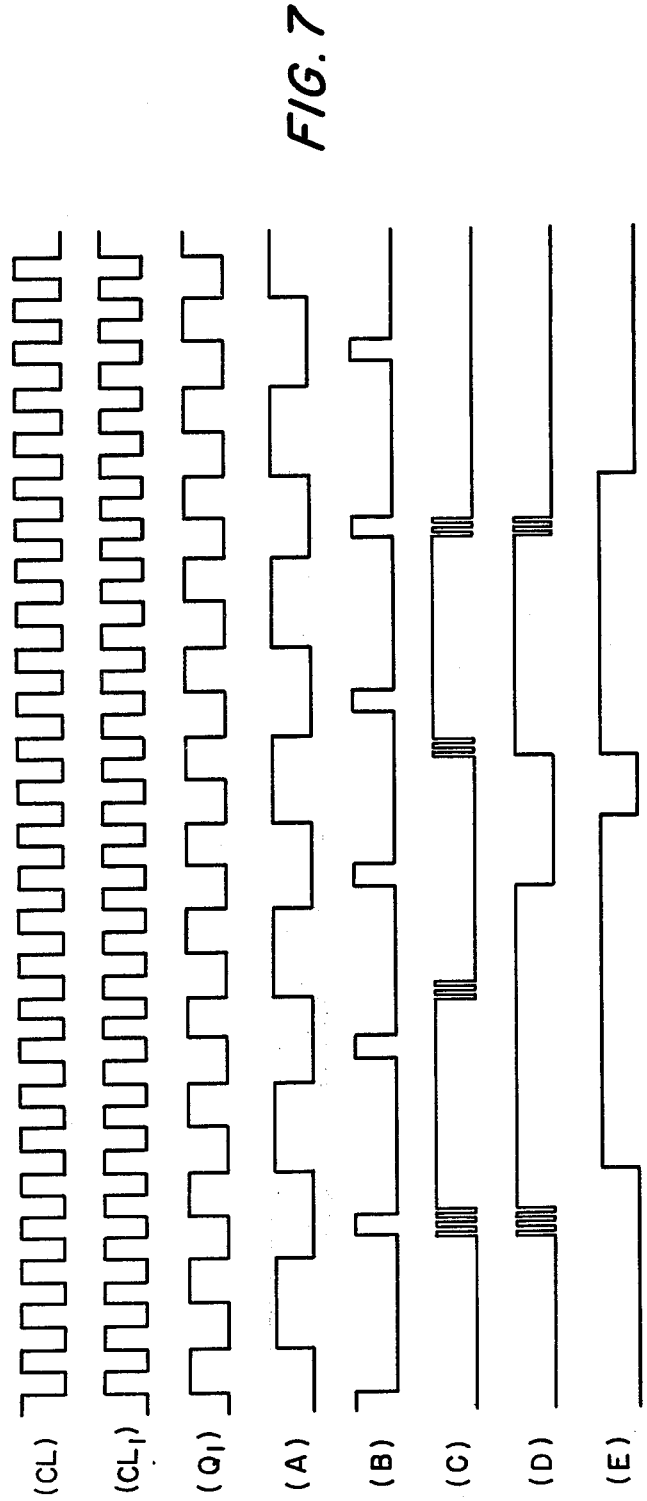
FIG. 7 shows the wave shapes of the switching circuit in FIG. 6.

Referring to the third embodiment of the present invention illustrated in the accompanying drawing at FIG. 6 and 7, 30 is a signal generating circuit which is composed of the input terminal "CL" to which the clock pulse train having two predetermined voltage levels sequentially occurring is applied, the inverter 31 which is connected to said input terminal "Cl", the flip-flop 32 having the input terminals $CP_1$ and $\overline{CP}_1$ which are respectively connected to the inverter 31 and said input terminal "Cl", the flip-flop 33 having the input terminals $CP_2$ and $\overline{CP}_2$ which are respectively connected to the output terminals $Q_1$ and $\overline{Q}_1$ of said flip-flop 32 and the three input NOR-gate 34 to which the outputs of said inverter 31, said flip-flop 32 and said flip-flop 33 are applied. Said signal generating circuit 30 includes the output terminal A which is connected to the output terminal $Q_2$ of said flip-flop 33, the output terminal B which is connected to the output terminal of said NOR-gate 34. Whereby said output terminal A generates the control signal as the first signal, said output terminal B generates the resetting pulse as the second signal.

Numeral $S_2$ is an ON-OFF switch such as a mechanical switch, one terminal of said switch $S_2$ is constantly connected to the input terminal H to which the high level voltage is applied, while the other terminal of said switch $S_2$ is connected to the connecting point C of the input side in the flip-flop circuit 35. Said flip-flop circuit 35 is composed of the inverter 36 which is connected to the connecting point C and the two inputs type NOR-gate 37 having one input terminal connected to the output side of said inverter 36. The output terminal B of said signal generating circuit 30 is connected to the other input terminal of said NOR-gate 37, the output terminal D of said flip-flop circuit 35 is connected to the output of said NOR-gate 37. Said output terminal D and connecting point C are connected to each other.

The input terminal of the transmission-gate 38 as the cutting circuit is connected to the output terminal D of said flip-flop circuit 35. The output side of said transmission-gate 38 is connected to the input side of the transmission gate 39 which is part of the memory circuit 40. Said memory circuit 40 includes said transmission-gate 39 and the inverters 41 and 42 which are connected to each other in series and are together connected in parallel to said transmission-gate 39. The output terminal E is connected to the output side of said transmission-gate 39 in said memory circuit 40. Further the control terminals of said transmission-gates 38 and 39 are connected in parallel to the connecting point A of said signal generating circuit 30, and other pair of said control terminals is connected to said connecting point "A" via the inverter 43.

Referring now to the description of operation of the switching circuit the clock pulse train CL illustrated in FIG. 7 is applied to the input terminal CL as indicated in FIG. 6, the high level voltage is always applied to the input terminal H, and further the mechanical switch $S_2$ is keeping in OFF-position.

With the above noted condition, said clock pulse is applied to the input terminal $CP_1$ of the flip-flop 32, and an inverted clock pulse train $CL_1$ is applied to the input terminal $\overline{CP_1}$. The frequency divided signal $Q_1$ having one half the frequency of the clock pulse train CL and having the waveform $Q_1$ in FIG. 7 appears at the output terminal $Q_1$ of said flip-flop circuit 32. The control signal A having one half the frequency of the output of flip-flop 32 and having the waveform A in FIG. 7 appears at the output terminal $Q_2$ of the flip-flop 33 to which said dividing signal $Q_1$ is applied. The resetting pulse B as the second signal and having the waveform B in FIG. 7 appears at said NOR-gate 34 to which said inverted clock pulse train $CL_1$, the dividing signal $Q_1$ and the control signal A are applied. Said resetting pulse B becomes as narrow as said clock pulse when said control signal A changes to a lower level. Since the other input terminal of said flip-flop circuit 35 to which said resetting pulse B is applied is connected to the mechanical switch $S_2$ the signal of the output terminal D becomes lower as indicated by wave D until said mechanical switch is operated to the ON-position. When said control signal A level is high, the transmission gates 38 and 39 which are controled by said control signal A are controlled as follows: first of all when said control signal A is higher in level said transmission gate 38 becomes conductive and said transmission gate 39 beocomes non-conductive. Therefore the switching output of a lower level is applied to the output terminal E via said inverters 41 and 42. Then, if the level of said control signal A is changed, the lower level voltage is memorized in said memory circuit 40.

Further, referring to the ON-positioned mechanical switch $S_2$ and said control signal A which is a lower level and the resetting pulse B which is a higher level. When said mechanical switch $S_2$ is operated to the ON-position the switching signal C having the chattering is applied to the input terminal C of said flip-flop circuit 35. Then the higher level signal D having the chattering is applied to the output terminal D of said flip-flop circuit 35. However, since said transmission gate 38 is kept non-conductive, the output of the output terminal E in said memory circuit 40 is maintained at to the lower level. When said control signal A changed to the higher level said transmission gate 38 becomes conductive and said transmission gate 39 becomes non-conductive, then the high level switching output E as represented by waveform E in FIG. 7 is applied to the output terminal of said memory circuit 40, and this condition of this circuit is maintained until next operation is started.

Referring to the OFF-positioned mechanical switch $S_2$ and said control signal A which is at a higher level. The switching signal C in which said chattering occurred changes to the lower level corresponding to the OFF-operation of said mechanical switch $S_2$. However, since the resetting pulse B of the lower level is applied to the other input terminal of said flip-flop circuit 35, the higher level output is applied to the output terminal D of said flip-flop circuit 35. When said resetting pulse B changed to the higher level, the output of the output terminal D of said flip-flop changed to the lower level. At this time, since said control signal A is at the lower level, said transmission gate 38 is non-conductive and said transmission gate 39 is conductive and, said memory circuit 40 output maintains the higher level. Afterwhile, when said control signal A changes to higher level, the conductive stages of said transmission-gates 38 and 39 are respectively reversed whereby said memory circuit 40 memorizes the lower level signal. Then the switching output E of the lower level is applied to the output terminal E of said memory circuit 40.

Further, referring to the ON-positioned mechanical switch $S_2$ and said control signal A which is at the higher level. The switching signal C in which the chattering occurs is applied to the connecting point C of said flip-flop circuit 35 in response to the ON-operation of said mechanical switch $S_2$. At this time, since the resetting pulse of the lower level is applied to the other input terminal of said flip-flop circuit 35 the higher level output is applied to the output terminal D of said flip-flop circuit 35. Further, said control signal A is at the higher level, said transmission-gate 38 becomes non-conductive, and the switching output E of the higher level is applied to the output terminal OUT via the inverters 41 and 42 of said memory circuit 40. After a while, said control signal A changes to the lower level whereby said transmission gate 38 becomes non-conductive and said memory circuit memorizes the higher level. Therefore, the switching output E which is applied at the output terminal E is kept to the higher level.

Further when said resetting pulse is at the higher level, and the mechanical switch $S_2$ is off, the output signal D of said flip-flop circuit 35 changes to the lower level corresponding to the change of the voltage level of the switching signal C in said mechanical switch $S_2$. At this time, since said control signal A changes to the lower level, said memory circuit 40 keeps the former at the higher level. Afterwards, when said control signal A changes to the higher level, said transmission gate 38 becomes conductive whereby the switching output of the lower level is applied to the output terminal E via the inverters 41 and 42 of said memory circuit 40.

According to the above noted embodiment of the present invention, in the ON-OFF operations of the mechanical switch, it is able to always obtain the switching output having no chattering caused by the operation of said mechanical switch.

This invention is not restricted to the above noted embodiment, for example, the transmission gate as the cutting circuit is able to change to the circuit which is composed of the general transistors.

According to the switching circuit of the present invention, the control signal as the first signal and the resetting pulse as the second signal which is synchronized to said first signal and having the narrower pulse width than the pulse width of said control signal are generated by the signal generating circuit. The output of said flip-flop circuit which is obtained by applying said resetting pulse and the switching signal of said mechanical switch is selectively applied to the memory circuit via the cutting circuit which is synchronized to said control signal whereby the switching output is obtained by said memory circuit. Therefore, it is able to decrease the power consumption by the narrow pulse width and the short time of said flip-flop 35 of being higher level. Further, since the chattering in the generating time of the resetting pulse is generated, the output of said flip-flop 35 is applied as the output E in the former situation which is memorized by said memory circuit. Then it is able to obtain the switching signal having no chattering without influence by the amount of the chattering.

Figure 9:
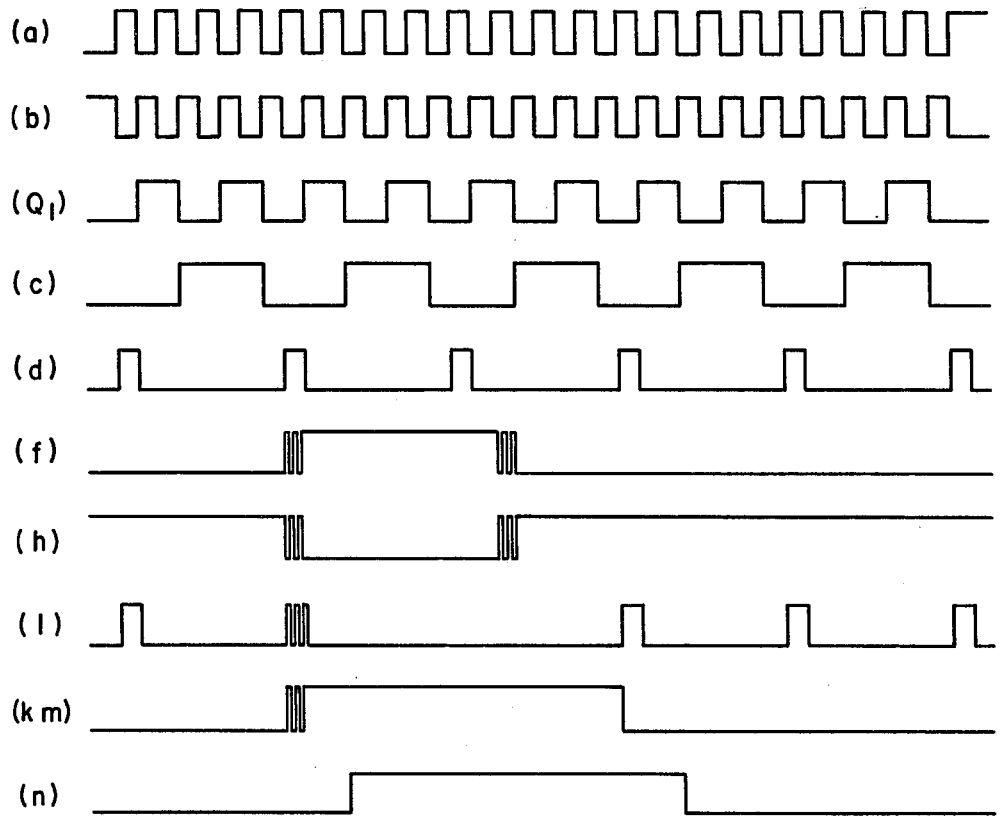
FIG. 9 shows the wave shapes of the switching circuit in FIG. 8.

Referring now to the fourth embodiment of the present invention illustrated by the accompanying drawings in FIGS. 8 and 9.

In FIG. 8, there is shown a switching circuit according to the present invention comprising a signal producing circuit 50 which includes an input terminal A to which is applied repetitive clock pulse having predetermined high level and low level voltages, an inverter 51 which is connected to the input terminal A, a first flip-flop 52 having input terminals $CP_1$, $\overline{CP}_1$ which are respectively connected to said input terminal A and to the output terminal B of said inverter 51, a second flip-flop 53 having input terminals $CP_2$, $\overline{CP}_2$ which are respectively connected to output terminals $Q_1$, $\overline{Q}_1$ of said flip-flop 52, and a NOR gate 54 having three input terminals which are respectively connected to said output terminal B of said inverter, to said output terminal $Q_1$ of said flip-flop 52 and to said output terminal $Q_2$ of said flip flop 53. The signal producing circuit 50, further includes an output terminal C which is connected to the output terminal $Q_2$ of said flip-flop 53 to produce a control signal as a first signal and an output terminal D which is connected to the output terminal of said NOR gate 54 to produce a reset pulse as a second signal.

An on-off switch $S_2$ is operated as a mechanical switch. An input terminal E to which a high level voltage is applied is connected to one end of the switch $S_2$. To the other end of the switch $S_2$ is connected a node F of the input of a switch signal controlling circuit 55. The switch signal controlling circuit 55 comprises a N-channel MOS transistor 56 for biasing in which a gate terminal is connected to said input terminal E, a drain terminal to said node F and a source terminal to an input terminal G to which a low level voltage is applied, an inverter 57 which is connected to said node F, a NAND gate 58 having two input terminals one of which is connected to the output of said inverter 57 through a node H, a P-channel MOS transistor 59 the gate of which is connected to the output of said inverter 57, and a P-channel MOS transistor 60 the gate of which is connected to the output of the NAND gate 58. The output terminal D of said signal producing circuit 50 is connected to the other input terminal of the NAND gate 58. Further, the drain terminals of the MOS transistors 59 and 60 are connected with each other so as to be connected to said input terminal E while source terminals thereof are respectively connected to input terminals K and L of a flip-flop circuit 61. In the flip-flop circuit 61 which comprises inverters 62 and 63, the output terminal of the inverter 62 is connected to the input terminal L of the inverter 63 while the output terminal M of the inverter 63 is connected to the input terminal K of the inverter 62. It is to be noted that the output of the flip-flop circuit 61 is generated from the output terminal M of said inverter 63.

A memory circuit 64 is connected to the output terminal M of the flip-flop circuit 61. The momory circuit 64 comprises transmission gates 65 and 66 as an electronic switch and inverters 67 and 68 which are connected in series. Control terminals of said transmission gates 65 and 66 are connected in parallel. One of them is connected to the output terminal C of said signal producing circuit 50 while the other is connected to the output terminal C through said inverter 69. The output terminal of the transmission gate 66 is connected to the output terminal N of the memory circuit 64, and said inverters 67 and 68 are connected in parallel to said transmission gate 66.

Referring to FIG. 9, there are shown waveforms for illustrating the operation of the switching circuit according to the present invention.

When to the input terminal A of the signal producing circuit applied is a clock pulse "a" having a waveform shown in FIG. 9(A), the clock pulse is further applied to the input terminal $CP_1$ of the flip-flop 52. To the input terminal $\overline{CP}_1$ is applied an inverted clock pulse "b" which is inverted through the inverter 51, as shown in FIG. 9(b). The clock pulse "a" frequency is reduced by a half by the flip-flop 52, so that ½ divided signal $Q_1$ having the waveform shown in FIG. 9($Q_1$) is generated from the output terminal $Q_1$ of the flip-flop 52. The frequency of the divided signal $Q_1$ is further reduced by a half by the flip-flop 53, so that a control signal "c" having the waveform shown in FIG. 9(c) is generated as a first signal from the output terminal $Q_2$ of the flip-flop 53. Further, the inverted clock pulse "b", the divided signal $Q_1$ and the control signal C are applied to the NOR gate 54, so that a reset pulse "d" is generated from the output terminal D thereof as a second signal having the waveform shown in FIG. 9(d). Said reset pulse "d" generated therefrom during the low level of the control signal "c" has a small pulse width which is equal to that of said clock pulse.

The switch signal controlling circuit 55 controls the switch signal of the mechanical switch $S_2$ by receiving said reset pulse "d" and produces a low level signal having waveform "m" shown in FIG. 9(m) when the switch $S_2$ is open. That is, when the mechanical switch $S_2$ is set to the off-position, a low level voltage is applied to the node F through the MOS transistor 56. At that time, a high level input signal "h" which has the waveform as shown in FIG. 9(h) is applied to the node H connected to the inverter 57 which is connected to the node F.

Said reset pulse "d" from the signal producing circuit 50 and said input signal "h" are applied to the NAND gate 58. When the level of the reset pulse "d" becomes high, the NAND gate 58 produces a low level signal by which the MOS transistor 60 is set to the on-position to produce a high level signal "l" having the waveform "l" as shown in FIG. 9(l). As a result, the flip-flop circuit 61 to which the output signal "l" of the switch signal controlling circuit 55 is applied produces from its output terminal M a low level signal "m" having the waveform as shown in FIG. 9(m).

In the memory circuit 64 receiving said signal "m", the transmission gate 65 is set to the on-position when the level of said control signal "c" is high while the transmission gate 66 is set to the off position at that time. Therefore, a low level switching output is produced from the output terminal N through the inverters 67 and 68. When the level of the control signal "c" is low, the transmission gate 65 is set to the off-position while the transmission gate 66 is set to the on-position, whereby the memory circuit is retained at the above-mentioned state, that is the low level state.

Next, describing the case that the mechanical switch $S_2$ is closed when the level of the control signal "c" is low and the level of the reset pulse "d" is high. When the mechanical swtich $S_2$ is closed, high level swtich signal "f" is applied together with a chattering to the node F of the switch signal controling circuit 55. As voltage level of the node F becomes high, a low level signal "h" is produced from the node H which is connected to the inverter 57 and it is applied to one input terminal of the NAND gate 58, whereby the voltage level of the input terminal thereof becomes low. Therefore, even if to the other input terminal applied is the high level or low level reset pulse "d", the output of the NAND gate 58 is not reduced to the low level.

Accordingly, the MOS transistor 59 is set to the on-position and MOS transistor 60 is set to the off-position. Therefore, the transistors 59 and 60 are not set to the on-position at the same time. A high level signal "k" is applied to the input terminal K of the flip-flop circuit 61. The flip-flop circuit 61 produces a high level output signal "m" from the output terminal M. The output signal from the flip-flop circuit 61 is applied to the memory circuit 64. At this time, the transmission gate 65 is in the off-position, the memory circuit 64 is still retained at the low level state. After that, when the level of the control signal "c" becomes high, the transmission gate 65 is set to the on-position while the transmission gate 66 is set to the off-position. Therefore, the high level output signal "m" of said flip-flop circuit 61 is applied to the output terminal N through inverters 67 and 68. As a result, a high level switching signal "n" is generated from the output terminal N. After that, the memory circuit 64 is maintained at the high level state even if said control signal "c" is changed to the high level.

Next illustrating the case that the opening of the mechanical switch $S_2$ is effected when the level of the control signal "c" is low. When the mechanical switch $S_2$ is opened, a low level switch signal "f" is applied together with the chattering to the node F of the switch signal controlling circuit 55 because the MOS transistor for biasing is in the on-position. As the voltage level of the node F lowers, a high level signal "h" is produced from the node H connected to the node F through the inverter 57 and it is applied to one input terminal of the NAND gate 58. But, since the output of said NAND gate 58 is retained at the high level when the level of the reset pulse "d" is low, the switch signal controlling circuit 55 produces the high level output in the same way as when the mechanical switch $S_2$ is closed. Consequently, a switching output produced from the output terminal N through the flip-flop circuit 61 and the memory circuit 64 is continuously retained at the high level. After that, when the level of said reset pulse "d" becomes high, said NAND gate 58 produces a low level output and makes the MOS transistor 60 set to the on-position to apply a high level signal "l" to the input terminal L of the flip-flop circuit 61. At this time, since the MOS transistor 59 is set to the off-position, the flip-flop circuit 61 produces a low level output "m". The memory circuit 64 continously applies high level switching outputs to the output terminal thereof without receiving the output signal "m" from said flip-flop circuit, because the control signal "c" is retained at the low level when the level of said reset pulse "d" is high. After that, a low level switching output "n" is produced from the output terminal N, since the low level signal "m" from the flip-flop circuit 61 is applied to the memory circuit 64 as the level of the control signal "c" becomes high. Generally, as the chattering occurs only at the start and the end of the switching operation of the mechanical switch, the present switching circuit removes the inconvenient chattering because of the reset pulse "d" synchronized with the read and the retention time of the memory circuit. Further, since the set signal and the reset signal are not applied at the same time to the flip-flop circuit 61 due to the function of the NAND gate 58, it is possible to obtain the switching output without the chaterring mentioned above and a lower current drain.

In addition, the present invention is not restricted to the embodiments shown in Figures. For instance, the MOS transistor 56 for biasing can be replaced by a resistance element, and the transmission gate used in the memory circuit as the electronic switch can be replaced by a circuit comprising a general transistor. In this way, various changes and modifications may be permitted.

As mentioned above, since the switching circuit according to the present invention comprises the signal producing circuit generating the control pulse as a first signal and the reset pulse as a second signal, the signal controlling circuit for controlling the switch signal generated by the operation of the mechanical switch, the flip-flop circuit synchronized with said control signal, and the memory circuit controlled by said control signal to produce switching outputs, the set pulse produced by the on-off operation of the mechanical switch and the reset pulse "d" from the signal producing circuit are not applied at the same time to the flip-flop circuit. Therefore, the flip-flop circuit is protected because a high current does not flow thereto, and the switching output is produced without the chattering which is apt to occur in the switching operation of the mechanical switch by properly setting the frequency of said control signal. Further, it is possible to decrease a power consumption since the width of the reset pulse from the signal producing circuit is narrower than that of the control signal therefrom. Furthermore, it is possible to use a simple on-off switch as the mechanical switch, so that construction is simplified.

What we claimed is:

1. A switching circuit for receiving an input signal under control of a mechanical switch having chatter and for developing in response thereto a chatter-free output signal, said switching circuit comprising:

a C-MOS inverter circuit comprised of a complementary pair of MOS transistors connected in series, each having a respective gate for receiving a reset signal, and said complementary pair of MOS transistors having an output terminal for developing an inverter output signal thereat;

a mechanical switch connected in series with said series-connected complementary transistor pair and having an open and a closed condition for applying an electrical signal under control of said mechanical switch to said series-connected complementary transistor pair, wherein said inverter circuit developes the inverter output signal when said mechanical switch is closed only in the absence of the reset signal;

a flip-flop circuit connected to receive the inverter output signal as an input signal, and having an output terminal for developing thereat a flip-flop output signal determined by the inverter output signal applied to said flip-flop circuit;

latching circuit means responsive to a clock signal longer than the reset signal and connected to receive the flip-flop output signal for developing said chatter-free output signal corresponding to the flip-flop output signal at a time the clock signal is applied to said latching circuit means; and means for developing said clock signal and said reset signal repetitively and out of phase and for applying the reset signal to said inverter circuit and for applying the clock signal to said latching circuit means, respectively, whereby said chatter-free output signal can change only after said inverter circuit receives the reset signal.

2. A switching circuit according to claim 1, wherein said flip-flop circuit is of the preferential resetting type and comprises a pair of inverter circuits each having a respective input terminal and output terminal; and means cross-connecting the input and output terminals of each of said inverter circuits with the output and input terminals of the other of said inverter circuits, respectively.

3. A switching circuit according to claim 1, wherein said latching circuit is comprised of a first gate circuit connected to receive an output signal of said flip-flop and connected for responding to said clock signal for passing the output signal of said flip-flop; a pair of inverter circuits connected in series and connected to receive the output signal of said flip-flop passed through said first gate circuit; and a second gate circuit connected between an output terminal of a second of said inverter circuits and an input terminal of a first of said inverter circuits and connected for responding to a complement of said clock signal for feeding back an output signal of said pair of inverter circuits to the input terminal of said first inverter circuit for maintaining the output signal when said first gate is ineffective to pass the output signal of said flip-flop.

4. A switching circuit for receiving an input signal under control of a mechanical switch having chatter and for developing in response thereto a chatter-free output signal, said switching circuit comprising:
a two-input NOR gate having a first input terminal for receiving in use a clock pulse signal;
an inverter circuit having an input terminal connected to an output terminal of said NOR gate and having an output terminal for developing an inverter output signal thereat connected to the second input terminal of said NOR gate;
a mechanical switch connected to both the input terminal of said inverter circuit and said output terminal of said NOR gate for applying an electrical signal thereto under control of said mechanical switch; and
memory means connected to receive the inverter output signal for developing in response thereto the chatter-free output signal of the switching circuit.

5. A switching circuit according to claim 4, wherein said inverter circuit is a C-MOS inverter circuit comprised of a complementary pair of MOS transistors connected in series and each having a respective gate which together define the input terminal of said inverter circuit.

6. A switching circuit according to claim 4, wherein said two-input NOR gate is comprised of a first P channel MOS transistor, a second P channel MOS transistor and an N channel MOS transistor connected in series in the named order, and a third P channel MOS transistor connected in parallel with said N channel MOS transistor, wherein said first P channel MOS transistor and said N channel transistor each have a respective gate which together define the first input terminal of said NOR gate, and wherein said second and third P channel MOS transistors each have a respective gate which together define the second input terminal of said NOR gate.

7. A switching circuit according to claim 4 wherein said memory means is comprised of a first gate circuit connected to the output terminal of said NOR gate and responsive to said clock pulse signal for conducting to pass the output of said NOR gate; a second gate circuit connected in series with said first gate circuit and responsive to a complement of said clock pulse signal for conducting; and a pair of series-connected inverter circuits connected in parallel with said second gate circuit for developing the chatter-free output signal when said first gate is non-conductive.

* * * * *